(12) United States Patent  (10) Patent No.: US 8,812,069 B2
Doll et al.  (45) Date of Patent: Aug. 19, 2014

(54) LOW LOSS JOINT FOR SUPERCONDUCTING WIRE

(75) Inventors: David W. Doll, Columbus, OH (US); Michael J. Tomsic, Columbus, OH (US)

(73) Assignee: Hyper Tech Research, Inc, Columbus, OH (US)

(*) Notice: Subject to any disclaimer, the term of this patent is extended or adjusted under 35 U.S.C. 154(b) by 759 days.

(21) Appl. No.: 12/693,158

(22) Filed: Jan. 25, 2010

(65) Prior Publication Data

US 2010/0190649 A1  Jul. 29, 2010

Related U.S. Application Data

(60) Provisional application No. 61/148,111, filed on Jan. 29, 2009.

(51) Int. Cl.
*H01B 12/00* (2006.01)
*H01L 39/02* (2006.01)
*H01L 39/24* (2006.01)
*H01R 4/68* (2006.01)

(52) U.S. Cl.
CPC ............ *H01L 39/02* (2013.01); *H01L 39/2487* (2013.01); *H01R 4/68* (2013.01); *Y10S 505/925* (2013.01); *Y10S 505/926* (2013.01)
USPC .............. 505/230; 505/925; 505/926; 29/599

(58) Field of Classification Search
USPC .............................. 505/230, 925, 926; 29/599
See application file for complete search history.

(56) References Cited

U.S. PATENT DOCUMENTS 4,420,091 A * 12/1983 Thorpe et al. ................... 220/3.7
4,673,774 A *  6/1987 Wake et al. ................... 174/94 R (Continued)

FOREIGN PATENT DOCUMENTS

CN  101291021  * 10/2008  .............. H01R 4/68
DE  3413167 A1  10/1985
(Continued)

OTHER PUBLICATIONS

Machine Translation of JP 10-284152.*

(Continued)

*Primary Examiner* — Paul Wartalowicz
(74) *Attorney, Agent, or Firm* — Michael J. Gallagher; David J. Dawsey; Gallagher & Dawsey Co., LPA

(57) ABSTRACT

A device and method for making a persistent joint allowing end terminations of superconducting $MgB_2$ wire to be joined with a superconducting bridge. Superconducting electromagnetic coils may be joined in series or joining of coil assemblies to current sources and the two ends of a persistent switch. The device includes wire filaments with end preparation exposing reacted $MgB_2$, inserted into a block and surrounded with Mg+B and/or $MgB_2$ in powder, solid, slurry or sol-gel form and subsequently reacted to establish a bridge of superconducting $MgB_2$ electrically connecting the superconducting $MgB_2$ wires. Autonomous operation of the superconducting background magnet coils in magnetic resonance imaging (MRI) and nuclear magnetic resonance (NMR) devices are allowed, or similar devices where autonomous operation of an $MgB_2$ based superconducting magnet is required. The low resistant joint will also be beneficial for other superconducting applications such as fault current limiters, motors, generators, etc.

23 Claims, 8 Drawing Sheets

(56) References Cited

U.S. PATENT DOCUMENTS

| | | | |
|---|---|---|---|
| 5,231,366 A | | 7/1993 | Haramaki et al. |
| 5,253,413 A | * | 10/1993 | Dorri et al. .................... 29/599 |
| 5,398,398 A | * | 3/1995 | Williams et al. ............... 29/599 |
| 5,410,288 A | * | 4/1995 | Dorri et al. .................... 335/216 |
| 6,133,814 A | * | 10/2000 | Okada et al. .................. 335/216 |
| 7,152,302 B2 | | 12/2006 | Morita et al. |
| 7,226,894 B2 | | 6/2007 | Raber et al. |
| 7,394,024 B2 | * | 7/2008 | Kohayashi et al. ......... 174/125.1 |
| 8,007,186 B2 | * | 8/2011 | Ashibe ............................ 385/95 |
| 2004/0124086 A1 | * | 7/2004 | Giunchi et al. ................. 205/51 |
| 2008/0207458 A1 | * | 8/2008 | Hong et al. .................... 505/238 |
| 2008/0236869 A1 | * | 10/2008 | Marte et al. ................ 174/125.1 |
| 2009/0062128 A1 | * | 3/2009 | Harada et al. ................. 505/238 |

FOREIGN PATENT DOCUMENTS

| | | | | |
|---|---|---|---|---|
| EP | 0806801 A2 | | 12/1997 | |
| EP | 1276171 A2 | | 1/2003 | |
| JP | 10284152 | * | 10/1998 | .............. H01R 4/68 |

OTHER PUBLICATIONS

Li et al. "High critical current joint of MgB2 tapes using Mg and B powder mixture as flux." Supercond. Sci. Technol. 21 (2008).*

International Search Report and Written Opinion of the International Searching Authority for International Application No. PCT/US10/22199, mailed Mar. 23, 2010, 10 pages.

R. Zeng, L. Lu, W. X. Li, J. L. Wang, D. Q. Shi, J. Horvat, S. X. Dou, M. Bhatia, M.D. Sumption, E. W. Collings, J. M. Yoo, M. Tomsic, and M. Rindfleisch, "Excess Mg addition MgB2/Fe wires with enhanced critical current density," J. Appl. Phys. 103, 083911 (2008).

Xiaohang Li, Liyang Ye, Dong Zhang, Dongliang Wang and Yanwei Ma, "Joints in MgB2 tapes and wires for persistent current operating magnets," 21st International Conference of Magnet Technology, 2010.

E.W. Collings, M.D. Sumption, and T. Tajima, "Magnesium diboride superconducting RF resonant cavities for high energy particle accelerators," Supercond. Sci. Technol. 17 S595-S601 (2004).

M.D. Sumption, M. Bhatia, M. Rindfleisch, J. Phillips, M. Tomsic, and E.W. Collings "MgB2 racetrack coil winding insulating and testing," IEEE Trans. Appl. Supercond. 15 1457-1460 (2005).

L. Ye, M. Majoros, A. M. Campbell, T. Coombs, D. Astill, S. Harrison, M. Husband, M. Rindfleisch, M. Tomsic, "Experimental studies of the quench behavior of MgB2 superconducting wires for fault current limiter applications," Supercond. Sci. Technol. 20, 621-628 (2007).

M. D. Sumption, M. Bhatia, F. Buta, S. Bohnenstiehl, M. Tomsic, M. Rindfleisch, J. Yue, J. Phillips, S. Kawabata, E. W. Collings, "Multifilamentary MgB2-based solenoidal and racetrack coils," Physica C 458 12-20 (2007).

Paul M Grant, Chauncy Starr and Thomas J. Overbye, "A Power Grid for the Hydrogen Economy," Scientific American Magazine, Jul. 2006.

Paul C. Canfield and Sergy L. Bud?ko, "Low-Temperature Superconductivity is Warming Up," Scientific American Magazine, Apr. 2005.

M.D. Sumption, M. Bhatia, M. Rindfleisch, M. Tomsic, S. Soltanian, S.X. Dou, and E.W. Collings, "Large Upper Critical Field and Irreversibility Field in MgB2 wires with SiC additions," Appl. Phys. Lett. 86 092507/1-3, 2005.

M.D. D Sumption, M. Bhatia, M. Rindfleisch, M. Tomsic, and E.W. Collings, "Transport and magnetic Jc of MgB2 strands and small helical coils," Appl. Phys. Lett. 86 102501/1-3, 2005.

M.D. Sumption, M. Bhatia, S.X. Dou, M. Rindfliesch, M. Tomsic, L. Arda, M. Ozdemir, Y., Hascicek, E.W. Collings, "Irreversibility field and flux pinning in MgB2 with and without SiC additions," Supercond. Sci. Tech. 17 (10) 1180-1184 (2004).

M.D. Sumption and E.W. Collings, "Stability and Instability in High Performance (Metastable) Composite Strands During I-V Measurement," Physica C 401 66-74 (2004).

M. Bhatia, M.D.Sumption, M. Tomsic, E.W. Collings, "Influence of Heat Treatment Schedules on Magnetic Jc and Phase formation in Bulk Superconducting MgB2," Physica C, 415 (4) 158-162 (2004).

M. Bhatia, M.D. Sumption, M. Tomsic and E.W. Collings, "Influence of heat-treatment schedules on the transport current densities of long and short segments of superconducting MgB2 wire," Physica C 407 (3-4) 153-159 (2004).

M.D Sumption, E.W. Collings, E. Lee, "Reduction and Elimination of External-Field Ac Loss in MgB2/Fe Wire by In-Situ Magnetic Shielding," Physica C 378-381 894-898 (2002).

Supplementary European Search Report of the European Patent Office for EU Application No. 10736329.3 mailed Jul. 17, 2013. 4 pages.

* cited by examiner

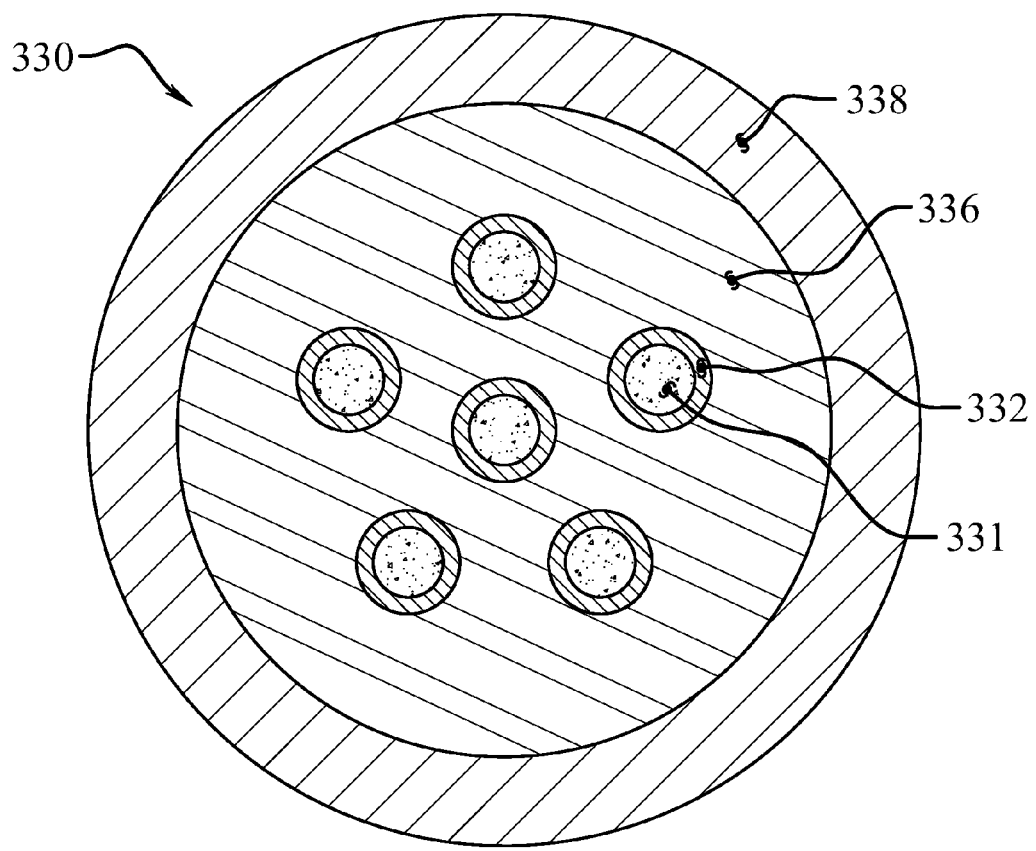
(Prior Art) *Fig. 10*

LOW LOSS JOINT FOR SUPERCONDUCTING WIRE

CROSS-REFERENCE TO RELATED APPLICATIONS

This application claims priority to U.S. Patent Application No. 61/148,111, filed Jan. 29, 2009, all of which is incorporated by reference as if completely written herein.

STATEMENT REGARDING FEDERALLY SPONSORED RESEARCH OR DEVELOPMENT

Not Applicable

BACKGROUND OF THE INVENTION

Superconducting wires have enabled high current density in a conductor, which has enabled high field magnets. This in turn has enabled magnetic resonance imaging (MRI) of increasing resolution and clarity, a goal for all medical diagnosis. Traditionally, the wire of choice has been niobium titanium (NbTi), developed several years ago for the intended use of achieving high magnetic fields in high energy physics applications. The emergence of MRI has since dominated the market for this product for a number of reasons. First, NbTi is ductile and can undergo considerable strain (~1%) before failing, thereby greatly simplifying manufacturing. Second, successive lengths can be easily joined by compressing the bare exposed NbTi filaments together and securing them in a pot of solder, and in particular, in a pot of low temperature solder. Despite all the benefits offered by NbTi wire, it has a single weakness that greatly affects its desirability as a MRI superconductor. It quenches (undergoes transition into normal electrical conducting mode) easily. Micro joules of energy can drive local temperatures from its stable operating temperature of 4.2° K. (liquid helium) to its operating limit of ~5.5° K., depending on current density and background field.

Wire joints are necessary because a MRI must be constructed of several segments of superconducting wire. A low resistance joint is also useful for other superconducting applications such as superconducting fault current limiters, motors, generators, etc. With the current technology using NbTi wire, this is relatively simple. A copper stabilizer is etched away from the very ductile and acid resistant NbTi and the individual filaments are compressed together, coiled and secured in a container of Wood's metal, which as one skilled in the art will recognize, is a fusible alloy that becomes liquid at approximately 70° C. (158° F.), and is a eutectic alloy of bismuth, lead, tin, and cadmium with the following percentage by weight: 50% Bi, 26.7% Pb, 13.3% Sn and 10% Cd. The joint is effectively persistent having an electrical resistance of $<10^{-12}$ Ohm, which is sufficient for normal MRI operation and maintenance.

MRIs have a device that permits the superconducting magnet to be autonomous. This persistent switch is made up of a small coil of superconductor co-wound with a resistive heater, which is actuated external to the magnet cryostat. It is electrically connected in parallel with the superconducting coil and a charging power supply. When the heater is on, it renders the persistent switch "normal" and more resistive than the superconducting magnet. A few volts applied across the leads cause current to flow from the high-current charging power supply into the superconducting magnet. When the target field and concomitant current are reached, the heater is turned off making the persistent switch superconducting and allowing the current to flow through it instead of the charging power supply. The charging leads are removed leaving the superconducting magnet with a persistent magnetic field, which will remain until the low electrical resistance joints and inherent low resistance of the superconducting wire in the magnet dissipate the field to an unacceptable level. At this point, the process is repeated recharging the coil. Persistent joints may be required in two places; in and out of a persistent switch and between wire coil segments that form a solenoid or other electromagnet shape made up of a plurality of wire segments.

Magnesium diboride ($MgB_2$) was shown to be superconducting in 2001 and was made into filamented wire form shortly thereafter. With its critical temperature of 39° K., it is highly temperature tolerant and not sensitive to local low energy inputs such as cracks in epoxy potting material. However, joining the ends of successive wire lengths presents several issues. $MgB_2$ has a low strain tolerance, 0.4% maximum and a working strain limit of 0.2%. This is not as sensitive as certain competitor high temperature superconducting (HTS) materials, such as BSCCO and YBCO, but it requires special consideration when attempting to place $MgB_2$, particularly reacted $MgB_2$, into direct contact with $MgB_2$, a necessary condition for joint persistence and applicability to MRI magnets. The limiting factor is inextricably tied to the required construction of $MgB_2$ wire.

$MgB_2$ wire has only a few constituent materials, generally four in number, each providing an essential function. The $MgB_2$ itself is frequently contained in a sheath of niobium (Nb) or iron (Fe). However, titanium (Ti), tantalum (Ta), and nickel (Ni) can be used to prevent the degrading effect of any surrounding copper (Cu) or copper alloy contamination during heat treatment, which can take place in a range of between approximately 1 and 1200 minutes in duration and a temperature of approximately 550° to 900° C. In a preferred embodiment, such heat treatment may take place in approximately 20 minutes at approximately 650° C. The Cu provides the essential stability for $MgB_2$ while it is carrying current in the superconducting mode. At the moment of incipient quench, the current leaves the $MgB_2$ and enters the Cu or Cu alloy. In its optimum condition, the Cu carries the current temporarily and either heats ohmically or cools, allowing the current to reenter the $MgB_2$. Around the outside of the wire is a strong, ductile material used to facilitate drawing to the required size and shape. Although there are other candidate materials, to date, the material of choice continues to be Ni—Cu alloys, such as in some embodiments, Monel® 400 (MONEL is a trademark of Special Metals Corporation, headquartered in New Hartford, N.Y., U.S.A.) It provides the ductility necessary to draw the Cu and Nb or Fe without failure while providing electrical and thermal properties suitable for stability when wound into a magnet.

In order to place the $MgB_2$ from one wire into direct contact with the $MgB_2$ in another wire, the surrounding material must be stripped away. This leaves the Nb, Fe, or other sheath materials and the $MgB_2$, which has a low strain tolerance vulnerable to fracture when compressed against its neighbor. This required exposure is exacerbated by the fact that any means of removing the Nb (note that the Ni—Cu alloy and Cu can be easily removed by chemical etching) destroys the $MgB_2$. If mechanical means are done improperly, cracks can occur thereby breaking the reacted $MgB_2$ and losing electrical continuity, while chemical means may etch away the $MgB_2$ faster than it does Nb, a refractory metal. The challenge is to expose a sufficiently large surface area of $MgB_2$ that is still supported by the Nb or Fe sheath to allow either direct contact of the $MgB_2$ from each of the two wires and/or addition of reacted $MgB_2$, and/or un-reacted Mg+B powder, and/or unreacted stoichiometric, or slightly off-stoichiometric, Mg+2B or Mg+2B+dopants for subsequent sintering.

A key problem to address is the manufacturability of a persistent joint. The goal is to be able to wind coils—there may be 5 to 8 in a single MRI solenoid shaped magnet—and join the ends to form a continuous wire connection. It is unlikely that pressing wires or filaments together will effect a persistent joint regardless how exposed the filaments are, because the Nb and Fe sheaths may be resistive, particularly in a background magnetic field. The possibilities include in-situ heat treating of the Mg+B, the stoichiometric or off-stoichiometric Mg+2B, or Mg+2B+one or more dopants with the components being in powder, semi-solid, or solid form, in intimate contact with the reacted $MgB_2$ wire ends. It may be necessary to clamp the two ends of adjacent coils into a single fixture, fill it with Mg+B, stoichiometric or off-stoichiometric Mg+2B, or Mg+2B+ one or more dopants and heat treat it without damaging the wires, i.e., without breaking the $MgB_2$ filaments.

Methods exist in current literature for both wire and joints for mixing stoichiometrically 53% by weight Mg and 47% by weight B powders with and without dopants to form wires as well as a bridge between two exposed ends of reacted $MgB_2$ superconductor to fabricate a joint. These disclosures fail in achieving the best method for forming the aforementioned superconducting bridge between the two ends of previously reacted $MgB_2$ wire. This less than desirable result stems from the fact that as the stoichiometric, or slightly non-stoichiometric mixed powders, Mg+2B forms into $MgB_2$, there is a decrease in density, thus, the $MgB_2$ that is forming in the joint is shrinking (pulling away) from the interface of the prepared $MgB_2$ reacted wires and the joint being formed. Because of this effect, there is the potential to not obtain the ideal superconducting properties through the wire-to-joint interface. The $MgB_2$ joint material forms as the Mg diffuses into the adjacent B particles. Thus, when a stoichiometric mixture (or one nearly stoichiometric) is used, the density of a Mg+2B powder mixture when converted to $MgB_2$ by heating, the density of the $MgB_2$ plus void volume at the interface of the reacted wires is less than the original un-reacted individual Mg+2B powders plus void.

The process of $MgB_2$ formation is one where the Mg, which surrounds B particles in a well mixed, nearly stoichiometric powder mixture, begins as precursors. In this specification, the term "superconducting precursor" and/or "precursor" shall mean those elements, compounds or mixtures containing both Mg and B, which upon suitable reaction processes, have the capacity to form electrically superconducting compounds. Precursor or superconducting precursors may also contain variable amounts of already formed $MgB_2$. The Mg diffuses into the B to form $MgB_2$, and voids (porosity) are present where the Mg was previously located. In a macro sense, this densely packed precursor mixture becomes less dense with the depletion of the magnesium (Mg). This density reduction is approximately 20% less than the original packed volume. As this $MgB_2$ formation takes place and the packed volume of the precursor powder mix becomes less dense, there is a tensile strain placed on the interconnecting superconducting bonds at the reacted $MgB_2$ wire surfaces and new $MgB_2$ material being formed in the joint. The joint is bounded by the confining fixed volume of the joint housing, and the fixed reacted wires on both sides of the joint. In this way, the shrinkage from the formation of the $MgB_2$ may result in breaking these bonds and diminishing the current carrying capacity of the $MgB_2$, formed to bridge the gap between two ends of reacted $MgB_2$ superconducting wire.

With the alarming news that helium supplies worldwide are dwindling fast, there is a scramble among MRI suppliers to develop conduction cooled magnets that use a cryocooler to replace the currently used liquid helium bath cooled closed systems. The added expense of initial filling and required refilling at any time there is a quench or when maintenance is required diminishes the marketability of any MRI system. Conversion from NbTi superconductor to $MgB_2$ superconductor in MRIs is a logical step in making the transition to a cryocooler based conduction cooled magnet since it takes advantage of the greater temperature tolerance of the $MgB_2$. This allows greater flexibility in designing the heat sink that maintains the coil temperature as a larger gradient can be tolerated. When operating below ~10° K., $MgB_2$ is well below its critical transition level, which minimizes the likelihood of a quench. This effect is particularly important for the persistent joint, which usually has a lower critical current than the wire. The persistent joint should be mounted on the heat sink as close as practicable to the cryocooler cold-foot and in the lowest field zone around the magnet.

One of the problems to be solved in joining superconducting wires is to connect the actual superconducting filaments with one another. Prior attempts to do so with $MgB_2$ have failed because the sheath material surrounding the $MgB_2$ is too electrically resistive to simply overlap, as is the standard method with NbTi currently in use. The actual $MgB_2$ must be in electrically superconducting contact between the two wires being joined. Ideally, the reacted $MgB_2$ needs to be exposed so that the mix of Mg+2B, $MgB_2$ or combinations of these, when reacted, form a superconducting bridge between the two wire ends.

Present disclosed methods to produce $MgB_2$ joint formation uses near stoichiometric mixture of powder form Mg+2B as the joint material. This produces $MgB_2$ formation that is less dense when compared to the original Mg+2B mixture. Thus, the newly formed $MgB_2$ tries to pull away from the prepared $MgB_2$ wire surfaces. The joint materials and arrangements in multiple embodiments of the instant invention allow for adjustment, that is, increase in joint volume of formed, so as to create a condition of positive pressure between the formed $MgB_2$ and the prepared $MgB_2$ wire surfaces. If parameters are adjusted properly, cracking due to over pressure and lower superconducting properties due to lower volume of materials in the joint when $MgB_2$ is formed are minimized.

SUMMARY OF THE INVENTION

Numerous variations, modifications, alternatives, and alterations of the various preferred embodiments, processes, and methods may be used alone or in combination with one another as will become more readily apparent to those with skill in the art, with reference to the following detailed description of the preferred embodiments and the accompanying figures and drawings.

An improved persistent joint is conceived that facilitates the use of $MgB_2$ superconducting wire in the new generation MRIs and like devices where persistent current and low resistance joints and magnetic field are required, such as in superconducting fault current limiters, motors, generators, etc. It addresses the critical need to connect reacted $MgB_2$ in one wire strand with reacted $MgB_2$ in another by a series of wire end preparations and in-situ reacting of Mg+B, Mg+2B, or Mg+2B+ one or more dopants in certain embodiments where the B and or Mg can be in solid, semi-solid, powder or sol-gel form, in intimate contact with the wires.

The instant invention includes a low loss joint for superconducting wire and a method of forming such a joint. In one series of embodiments, the low loss joint includes a joining block with a variable volume block cavity volume, at least a first variable position closure, and at least one superconducting wire termination assembly port.

At least one superconducting wire enclosed at least in part with superconducting wire stabilizer removed from around any filaments enters the joining block through a superconducting wire termination assembly port, and a superconducting joining material is in electrical communication with the at least one superconducting wire.

In certain embodiments which shall be discussed further below, it may be desirable to compress certain precursors of the superconducting joining material. The first variable position closure may be a threaded cap that can be tightened to achieve such compression. In other embodiments, it may not be desirable to compress precursors to, or the superconducting joining material itself. In such cases, it may be possible or desirable to form a poured cap by pouring and then hardening a layer of liquefied metal, such as Wood's metal, to protect the superconducting joining material.

The joining block may be a single unit, while in other embodiments it may be multi-part, and may further include an insulator electrically insulating the joining block from a heat sink. The joining block may be formed from various materials and to various parameters, and may be formed at least in part by copper and a second metal selected from the group of metals consisting of stainless steel and chromium. In certain embodiments, the second metal may fully chemically separate the copper from the internal body surface to prevent undesirable chemical interaction between the joining block and the superconducting joining material. As a performance parameter, one skilled in the art may be able to fabricate low loss joints having an electrical resistance of less than $10^{-12}$ Ohm.

The low loss joint may include a superconducting wire termination assembly with a superconducting wire termination assembly body extending into the block cavity and a superconducting wire termination assembly wire opening at least partially enclosing the superconducting wire. A portion of the superconducting wire stabilizer may be stripped back some distance from the termination by chemical etching, or other means, leaving an exposed segment of superconducting wire. The superconducting wire may have a superconducting wire cut surface that is cut at an angle between approximately 10 and 90 degrees to a longitudinal axis of the superconducting wire. This can be done by mechanical means such as with a diamond cut off saw, grinding tool, etc.

The superconducting wire may also be cut by a wide variety of other methods, subject to certain difficulties in mechanical cutting such as are described above. In one embodiment, the superconducting wire cut surface is cut by means of a laser. In certain embodiments, it may be necessary to polish the superconducting wire cut surface after cutting, and in consideration of certain difficulties involved in mechanical handling and polishing as described above, it may be desirable to polish the superconducting wire cut surface with Boron (B) powder having a grit size less than 1 micron.

The superconducting joining material may be formed in a wide variety of methods, all of which are envisioned here, although only certain embodiments will be discussed. In one series of embodiments, the superconducting joining material may be a powder, semi-solid, solid, or sol-gel selected from the group of materials consisting of $MgB_2$, Mg, B, and mixtures thereof, and in some cases, compressed to 60% to 100% of maximum density and subsequently heat reacted to form a superconducting material. In other embodiments, the superconducting joining material (600) further comprises $MgB_2$ gel.

In yet other embodiments, the block cavity may include a lining comprising Mg in the form of compacted powder, foil, or strips formed on at least a portion of the internal body surface, separate from any B powder or solid form B in order to provide a further, or even possibly an exclusive, source of Mg for reaction into superconducting joining material.

The low loss joint of the instant invention may be formed in a wide variety of ways, including but not limited to the following. In one set of embodiments, at least one superconducting wire may be cut to form a superconducting wire cut surface, and the cut surface placed within a joining block having a variable volume block cavity. The variable volume block cavity volume may then be at least partially filled with at least one metallic material in powder, solid, sol-gel, or semi-solid porous form, selected from the group of metallic materials consisting of Mg, B, and mixtures thereof. These precursors may then be sealed, in some embodiments, from an ambient atmosphere by sealing the first block opening with a first variable position closure which may be tightened to compress the powder to between 60% and 100% of maximum density. While under compression, the joining block containing the compressed precursors may be heated to a predetermined temperature of at least 550° C. and not more than 900° C. and maintained at that predetermined temperature for a time of at least one minute and not more than 1200 minutes.

The joining block may then be slowly cooled, and eventually, for use, cooled to a superconducting temperature as required for the materials used. In other embodiments, Mg may be provided by means of a Mg lining of the block cavity.

In another series of embodiments, that may not require compression of precursors, at least a portion of the variable volume block cavity volume may be filled with a gel of $MgB_2$, B only, a mixture of Mg+2B, a mixture of Mg+2B+dopants and then heating the gel to evaporate volatile compounds and solidify the gel. The gel form could also be poured as gel of B only first around the wires to be joined, then on top of that as a gel of only Mg and subsequently heated to drive off volatiles. This would be followed by heat treating to a temperature between 550° and 900 C. The first block opening may then be sealed from an ambient atmosphere with a poured cap formed from a liquid and subsequently hardened. The joining block may then be cooled, for use, to a superconducting temperature.

In its most general configuration, the present invention advances the state of the art with a variety of new capabilities and overcomes many of the shortcomings of prior devices in new and novel ways. In its most general sense, the present invention overcomes the shortcomings and limitations of the prior art in any of a number of generally effective configurations. The instant invention demonstrates such capabilities and overcomes many of the shortcomings of prior methods in new and novel ways.

BRIEF DESCRIPTION OF THE DRAWINGS

Without limiting the scope of the low loss joint for superconducting wire as claimed below and referring now to the drawings and figures, all shown not-to-scale:

FIG. 10 shows a cross sectional view of a prior art superconducting wire and superconducting wire stabilizer, as defined herein.

Figure 1:
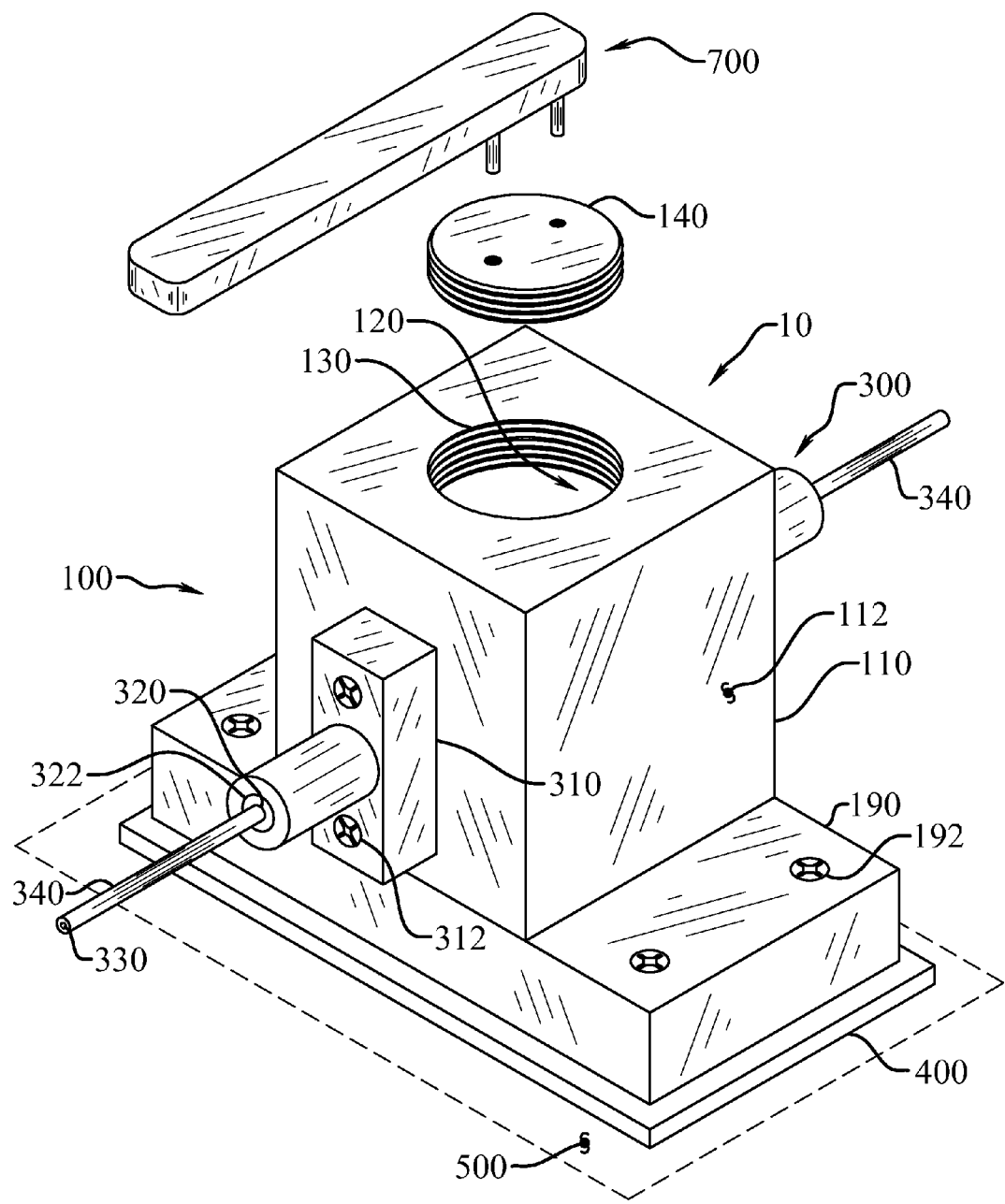
FIG. 1 shows a partially exploded elevated perspective view of an embodiment of a low loss joint for superconducting wire.

These drawings are provided to assist in the understanding of the exemplary embodiments of the device as described in more detail below and should not be construed as unduly limiting the device. In particular, the relative spacing, positioning, sizing and dimensions of the various elements illustrated in the drawings are not drawn to scale and may have been exaggerated, reduced or otherwise modified for the purpose of improved clarity. Those of ordinary skill in the art will also appreciate that a range of alternative configurations have been omitted simply to improve the clarity and reduce the number of drawings.

DETAILED DESCRIPTION OF THE INVENTION

The low loss joint (10) for $MgB_2$ superconducting wire (330) and method of forming the enables a significant advance in the state of the art. The preferred embodiments of the device accomplish this by new and novel arrangements of elements and methods that are configured in unique and novel ways and which demonstrate previously unavailable but preferred and desirable capabilities. The detailed description set forth below in connection with the drawings is intended merely as a description of the present embodiments of the device, and is not intended to represent the only form in which the present device may be constructed or utilized. The description sets forth the designs, functions, means, and methods of implementing the device in connection with the illustrated embodiments. It is to be understood, however, that the same or equivalent functions and features may be accomplished by different embodiments that are also intended to be encompassed within the spirit and scope of the claimed device.

At a baseline, "superconducting wire," as the term is generally used in the art, is frequently composed of certain substructures, which shall be defined as follows: The term "superconducting wire" shall mean the superconducting elements of a wire, which in a typical embodiment comprise superconductant areas (331), typically $MgB_2$ areas; and superconductant sheath areas (332), typically Nb areas (although in some embodiments Fe may be substituted for Nb, and for the purposes of this specification, the terms "Niobium" and "(Nb)" shall be deemed to further include Nb, Fe and mixtures and alloys thereof); and collectively and without regard to their metallurgical or chemical composition, these superconducting areas shall constitute the superconducting wire (330). When a superconducting wire (330) is cut, the cut superconducting areas, typically superconductant areas (331) ($MgB_2$) and superconductant sheath areas (332) (Nb), shall collectively constitute the superconducting wire cut surface (333). Such superconducting elements are typically surrounded by other metallic areas, which while electrically conductive and not therefore within the traditional definition of "insulating" are nonetheless not superconductive. These "not superconductive" areas, which in a typical embodiment consist of areas of supporting matrix areas (336), typically Copper (Cu) and supporting matrix sheath areas, (338) typically Ni—Cu alloy, shall collectively constitute the superconducting wire stabilizer (340). Also, for the purposes of this specification and claims, the term "metal" and "metallic" shall be deemed to include materials sometimes classified as being semi-metallic, and in particular, shall include Mg, B, and $MgB_2$.

Certain design elements are found in many embodiments of the low loss joint (10). For example, supportive wire terminations may be an important feature of an assembly-ready coil. They may be added after the wire has been reacted, insulated and wound onto the final former and impregnated with epoxy, which may in turn be done before or after reaction depending on processing logistics. Wire ends are prepared by exposing the $MgB_2$ filaments by cutting, or in some embodiments one might say scarfing them, either square or ninety degrees or at a low angle, which by way of example only and not limitation, may be between approximately 10 and 90 degrees. This typically exposes the $MgB_2$ while leaving it supported by the Nb or Fe sheath. The joints may be prepared by any convenient method, such as grinding, diamond sawing, laser cutting, or any other cutting means as would be understood by one skilled in the art, although attempts to do this by mechanical means have shown limited success. As one skilled in the art would expect, the fragile $MgB_2$ filaments are easily fractured, so care must be taken in preparing the ends of the reacted $MgB_2$ wire, as even the finest grinding grit may cause cracks that cannot be easily healed in a subsequent heat treatment in the presence of Mg+B fill. A removable cap may cover the wire end terminations during handling and is removed at assembly with the mating wire termination. The wire ends rest on part of the structure of the wire terminations in order to prevent fracture during handling and mounting.

An alternate solution, as will be discussed below, to the problem of unavoidable fractures of the reacted $MgB_2$ may be to use solid forms of B and Mg that are separated and not mixed, a sol-gel form of Mg+2B either separated or mixed, a mixture of B powder with 0-20 wt % Mg separated from the remaining Mg, in place of stoichiometric, or nearly stoichiometric, mixed fine powder Mg+2B to fill in around the scarfed ends of the wires to be joined. A drying and curing process involving low heat would then convert the sol-gel back into a solid, thereby mending the cracks. Also, the 100% B or B with 0-20 wt % Mg could be placed in the joint area between the wires and the remaining Mg for reaction and would be outside the joint area between the two wires to be joined.

In one embodiment of the low loss joint (10), two prepared wire terminations to be joined are bolted to either side of a hollow block, penetrating to an inner cavity of the block, such that the exposed scarfed wires are generally oriented upward. This upwards orientation may assist with later bonding and stability of the wires, and may not be a required orientation. The block may be otherwise closed everywhere except for an opening at the top. Here, a $MgB_2$, Mg+2B or Mg+2B+ dopants precursor material is introduced according to several options.

Precursor, may be in the form of Mg+2B+$MgB_2$ mixed, Mg+2B mixed, $MgB_2$, B plus Mg not mixed, B plus 0-20% wt % Mg mixed plus separate Mg in the form of powder, solid or sol-gel, or other combinations as would be known by one skilled in the art. In the case of certain precursor options, particularly with powders, they can be compressed before heat treatment at 550°-900° C. for 1-1200 minutes, and in a preferred embodiment, for 650° C. for approximately 20 minutes. The compression may be accomplished with a threaded cap and/or a keyed plunger, and a spanner wrench is a common tool to tighten such large diameter thin caps. The bottom of the cavity may have a second opening sealed by a second cap, with such design being intended to simplify formation of the block.

The use of powder precursor raises the problem that compression can create cracks in the $MgB_2$ filaments that the powder cannot infiltrate and bridge to ensure electrical connectivity. This problem may be solved in another embodiment by the use of a sol-gel form of $MgB_2$, which in its liquid form, can infiltrate as well as surround the $MgB_2$ wire ends. The sol-gel precursors may be poured into the block and first heat treated at a low heat to evaporate the liquid compounds, as would be known by one skilled in the art, and then subsequently heat treated at a higher heat and longer time, which one skilled in the art would know to be at 550°-900° C. for 1-1200 minutes, and in a preferred embodiment, for 650° C. for approximately 20 minutes. The heat treatment may be accomplished with a brazing device or comparable portable heating device that can hold the joining block and heat to the required temperature and time without bending or kinking the $MgB_2$ wire sufficiently to destroy the strain-limited filaments. The volume around the joint may be flooded by any convenient means with an inert gas to prevent unwanted oxidation from ambient air during heat treatment.

If a sol-gel process were used, the block may not necessarily require a plunger and cap. Instead, the volume above the reacted $MgB_2$ in the cavity could be filled with Wood's metal in order to secure and protect the joined wires from movement or damage. It is noteworthy that Wood's metal is currently used to secure joints between NbTi wires.

It is important to maintain a joint between two superconducting wires at the lowest temperature available in the cryostat. With bath cooling in helium used in nearly all MRIs, the joint is placed at the lowest point in the bottom of the cryostat. This ensures that it is the last part of the coil to be uncovered as the liquid helium level lowers. In a conduction cooled MRI, the joint is generally mounted on the heat sink as close to the cryocooler as practicable. A thin layer of electrical insulation, commonly a phenolic like G10, is required at the interface with the mounting surface where appropriate to keep the superconducting magnet electrical circuit insulated from the dewar or adjacent coil segments. Any mounting screws (not shown) must also be electrically insulated to electrically separate the block and heat sink. This is commonly done with a phenolic sleeve and washer, also commonly made of G10.

Upon completion of the low loss joint (10) connecting two ends of the $MgB_2$ superconductors, urethane or comparable compliant polymer can be added to the opening of the wire terminations around the wire in order to avoid sharp bends where the wire passes through the small holes in the wire terminations. This is typically done after heat treatment in order to spare the polymer any adverse effects from the heat treatment.

There are several ways of connecting two ends of reacted $MgB_2$ superconducting wire in a manner that places reacted $MgB_2$ material between them superconductively connected to both. In general, this involves chemically etching away the Ni—Cu alloy and copper from the barrier (Nb or Fe) protected $MgB_2$ and subsequently exposing the $MgB_2$ itself by some means. A second step involves placing the two ends into a closed container where fresh powder precursor and/or $MgB_2$ powder is added and reacted simultaneously with the wire.

When magnetic coil designs and fabrication means permit, i.e., when all components can withstand the approximately at least 550° C., or higher, reaction temperature, the $MgB_2$ wire can be reacted in the final configuration including terminations and joints. Un-reacted wire is not particularly strain limited with mechanical failure of the sheath as the only critical item. This allows the complete assembly to be formed, reacted, impregnated with epoxy and integrated into the device, commonly an MRI, without risking breaking the $MgB_2$ filaments. In this way, exposed Mg+2B, $MgB_2$, or Mg+2B+dopant powder in the wire filaments, which are themselves composed of packed powder, are placed in contact with precursor joint material using any of the options described previously in the joint and reacted together ensuring superconducting continuity. A key limitation with such in situ reaction of an entire assembly, lies in the logistics of successfully heating an entire coil, including such components as formers, to the required temperature and time levels to react the Mg+2B, $MgB_2$, or Mg+2B+dopant.

In creating prepared ends of the filaments to be joined, one attempts to avoid contaminating the exposed reacted $MgB_2$ wire surface with the grinding grit or other media used in the process. One embodiment of the design is the use of 100% nano B grit (less than 1 micron B powder) whose hardness is fully sufficient to remove the sheath material, i.e., the Nb, Fe or other suitable barrier between the $MgB_2$ and the Cu containing superconducting wire stabilizer (340). A nano B grit will leave behind traces of B that will react with Mg to enhance the bond between the reacted $MgB_2$ in the wire ends to be joined and the $MgB_2$ formed in the joint. This may be advantageous, since even if a joint is laser cut, contamination from cutting may make grinding of an exposed surface desirable.

In certain embodiment, a variety of methods may be used to introduce the Mg into the joint enclosure. Simply introducing close to stoichiometric amounts of Mg and B precursor powder into an enclosed space containing prepared ends of reacted $MgB_2$ wires has been shown to produce less than ideal superconductivity performance. In order to overcome this limitation, certain embodiments may be employed, particularly in light of the pre-heat treatment step that supplies the required amount of Mg for stoichiometry, without leaving voids in the reacted $MgB_2$. One improved method for producing a joint is to introduce solid Mg or Mg powder close to well packed B powder (or B mixed with 0-20 wt % Mg) or solid B shape, but not mixed close to a conventional stoichiometric mixture of Mg+2B. When the Mg reaches its vaporization temperature, beginning at about 550° C., it infiltrates the B powder or solid shape allowing formation of $MgB_2$, given sufficient time.

In one embodiment of a method, the joint material may comprise 100% B powder, compacted to 60-100% of theoretical density with one or more dopants optionally added to the B powder, placed in the joint area touching the two reacted $MgB_2$ wire surfaces, with Mg powder or solid shapes of Mg for a source of Mg during heat treatment outside the B powder. In one group of embodiments, the Mg may take the form of a Mg lining of the cavity, of variable mass, as would be understood by one skilled in the art. As the Mg vaporized during heat treatment diffuses into the interior B, the volume of $MgB_2$ material that forms increases increased compared to the volume of B, thus applying a positive pressure between the newly formed $MgB_2$ and the $MgB_2$ wire surfaces. To avoid over pressure, resulting in cracking, or under pressure, resulting in lower superconducting properties, the percentage of B compaction can be controlled from 60-100%, an optimized percentage below 100% being ideal. In a typical embodiment, a compaction to between 70% and 80% of maximum compaction is employed.

In another embodiment, the joint material consists of B powder mixed with Mg powder in a less than stoichiometric relationship, where the B powder varies from 70-99% by weight, and Mg varies from 1 to 30% by weight, thereby totaling 100% by weight. In certain embodiments, the ratio between Mg and B may be on the order of 9:1. This mixture is compacted to 60-100%, and often typically 70%-80%, of theoretical density, with one or more dopants optionally added to the Mg+2B mixture. The mixture may be placed in the joint area touching the reacted $MgB_2$ wire surfaces. Mg powder or solid Mg shapes for a source of Mg during heat treatment may be placed outside this mixture to supply additional Mg. As the vaporizing Mg diffuses into the B plus Mg mixture during heat treatment, the volume of $MgB_2$ material in the joint area increases compared to the original B plus Mg mixture thus applying a positive pressure between the newly formed $MgB_2$ and the $MgB_2$ wire end surfaces. To avoid over pressure, which would result in cracking the $MgB_2$, or under pressure, which would result in lowering the superconducting properties, the percentage of Mg in the mixture with B can be varied and the degree of compaction of the mixture can be varied in a controlled manner from 60-100%.

In various embodiments, the heat treatment is accomplished in situ with any convenient heating method (torch, resistive, inductive, etc.), using a portable heating device that can hold the joining block and heat to the required 550°-900° C., and maintain that temperature for 1-1200 minutes without bending or kinking the $MgB_2$ wire sufficiently to destroy the strain-limited filaments.

In yet another embodiment, the $MgB_2$ precursor may be mixed with a solvent in slurry form, as opposed to the use of dry powders. The slurry mixture can be poured into the joint and then slightly heated to drive off the solvent. Compression to obtain a 60-100% compaction density, as described above may be necessary. Potential slurries can be used, such as B only, or B plus Mg mixture, in the joint area between the two joined MgB2 wires, and include the use of a second slurry on top of just Mg powder.

With regards to FIGS. 1-10, a low loss joint (10) for superconducting wire (330) and method for making such a low loss joint (10) is described in numerous embodiments. For the purposes of this specification and claims, the term "metal" and "metallic" shall be deemed to include materials sometimes classified as being semi-metallic, and in particular, shall include B. A typical illustration of superconducting wire is seen in FIG. 10.

"Superconducting wire," as the term is generally used in the art, is composed of certain sub-structures, which shall be defined, and are illustrated in FIG. 10 as follows: The term "superconducting wire" shall mean the superconducting elements of a wire, which in a typical embodiment comprise superconductant areas (331), typically $MgB_2$ areas, and superconductant sheath areas (332), typically Nb areas, (although in some embodiments Fe may be substituted for Nb, and for the purposes of this specification, the terms "Niobium" and "(Nb)" shall be deemed to further include Niobium (Nb), Fe and mixtures and alloys thereof); and collectively and without regard to their metallurgical or chemical composition, these superconducting areas (331 and 332) shall constitute the superconducting wire (330).

When a superconducting wire (330) is cut, the cut superconducting areas, typically the superconductant areas (331), ($MgB_2$) and superconductant sheath areas (332) (Nb) shall collectively constitute the superconducting wire cut surface (333) as taught herein. Such superconducting elements are typically surrounded by other metallic areas, which while electrically conductive and not therefore within the traditional definition of "insulating" are nonetheless not superconductive. These "not superconductive" areas, which in a typical embodiment consist of areas supporting matrix areas (336), typically Cu, and supporting matrix sheath areas (338), (typically Ni—Cu) also seen well in FIG. 10, shall collectively constitute the superconducting wire stabilizer (340).

In multiple embodiments taught herein, the low loss joint (10), seen well in FIGS. 1, 2, 5, and 6, includes a joining block (100) having a body (110) with an external body surface (112) and an internal body surface (114). The joining block (100) is at least hollow in part, and has a variable volume block cavity (120) in releasable fluid communication with an ambient atmosphere through at least a first block opening (130), a variable volume block cavity volume (122), at least a first variable position closure (140), and at least one superconducting wire termination assembly port (170).

At least one superconducting wire (330) enclosed at least in part with superconducting wire stabilizer (340) enters the joining block (100) through the at least one superconducting wire termination assembly port (170) and may have at least one superconducting wire termination assembly (300) enclosing the at least one superconducting wire (330) extending into the block cavity (120) from the external body surface (112) to the internal body surface (114), In other embodiments, the superconducting wire (330) may be formed integrally with the joining block (100).

Figure 5:
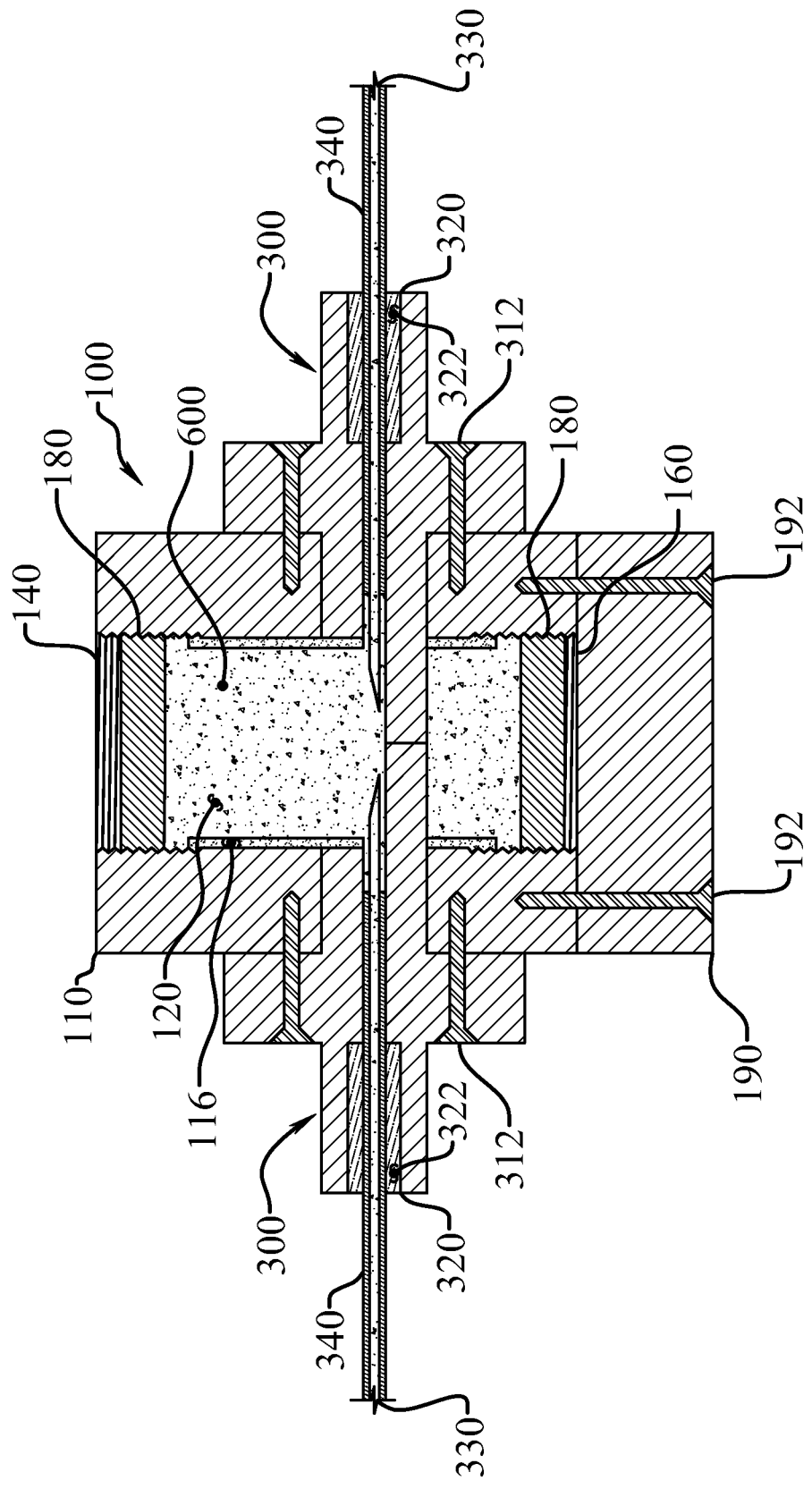
FIG. 5 shows a cross section view of an embodiment of a low loss joint for superconducting wire.
Figure 6:
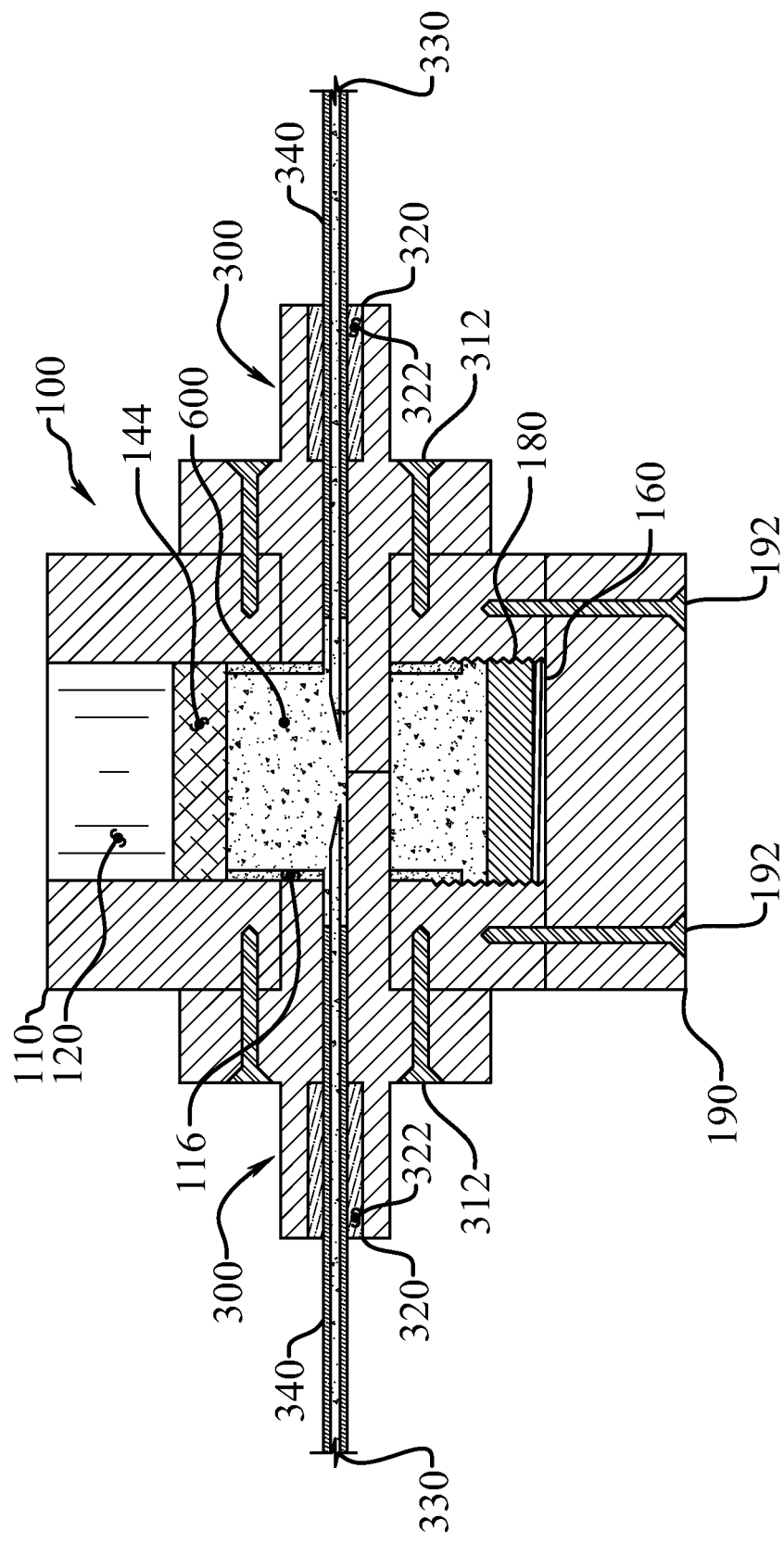
FIG. 6 shows a cross section view of an embodiment of a low loss joint for superconducting wire.

As seen in FIGS. 5 and 6, the block cavity (120) may contain at least one superconducting joining material (600) in electrical communication with the at least one superconducting wire (330). As seen in FIGS. 1-3 and 5-6, in some embodiments, a plurality of superconducting wire termination assemblies (300) may enter the joining block (100) with each superconducting wire termination assembly (300) at least partially enclosing one superconducting wire (330). However, one skilled in the art will realize, and hence it is not illustrated herein, that it is envisioned that a single superconducting wire termination assembly (300) may partially enclose two or more superconducting wires (330).

Figure 2:
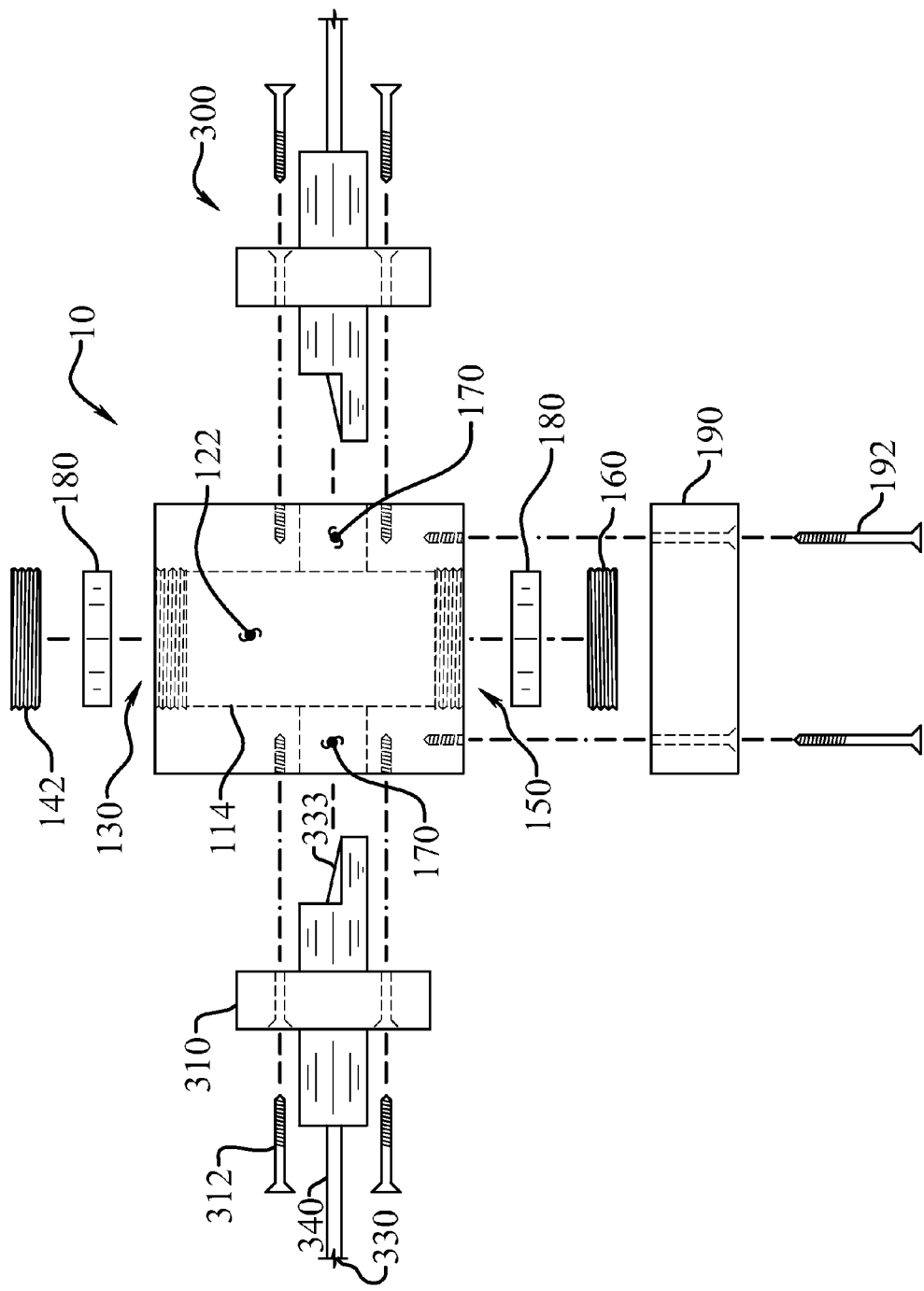
FIG. 2 shows a cross section view of the embodiment of the FIG. 1.
Figure 3:
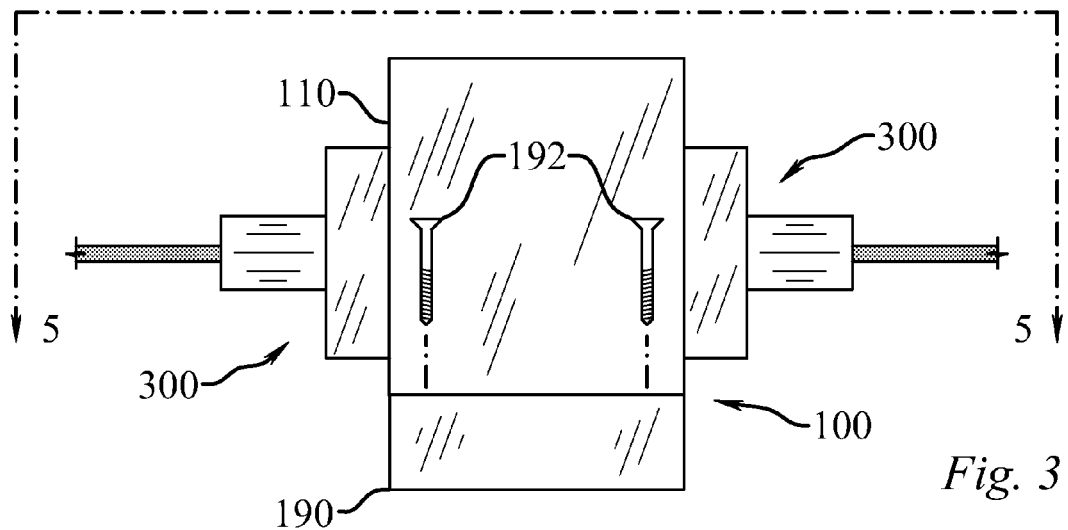
FIG. 3 shows a side elevation view of the embodiment of the FIG. 1.
Figure 4:
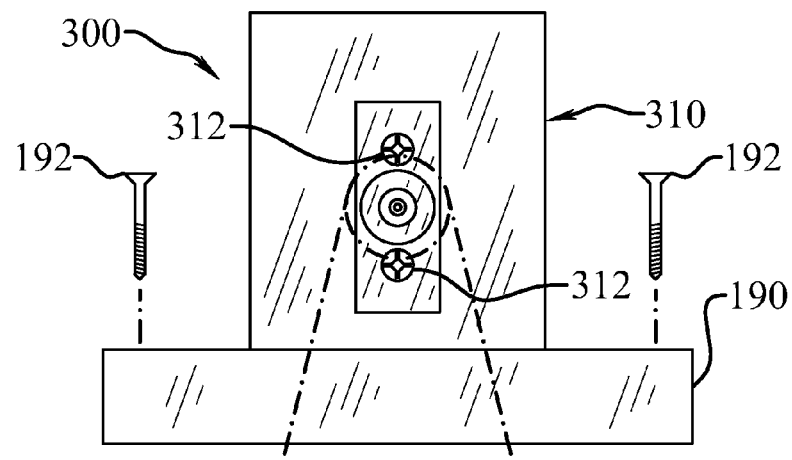
FIG. 4 shows an end elevation view of the embodiment of the FIG. 1.
Figure 4:
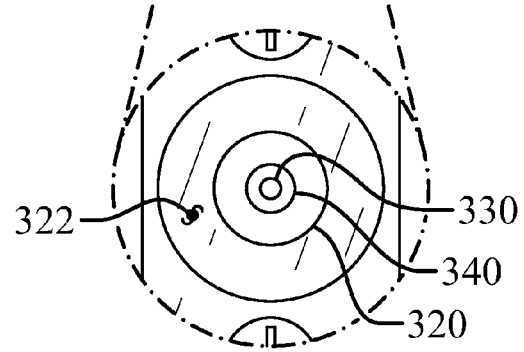

As seen well in FIGS. 2, 5, and 6, it may be desirable to provide a second block opening (150) and for the joining body (110) to have a second block closure (160). This may, by way of example and not limitation, make it easier to machine or otherwise form the joining block (100), and one skilled in the art will realize that there are few limitations on the number of block openings (130, 150) and block closures provided (140, 160). It is not required that all block closures (140, 160) necessarily be variable position block closures (140) for the following reasons.

In certain embodiments which shall be discussed further below, it may be desirable to compress certain precursors of the superconducting joining material (600). In such embodiments, as seen in FIG. 2, it may be desirable to provide the first variable position closure (140) as a threaded cap (142). Tightening down such a cap with some type of cap tightener (700) as seen in FIG. 1, such as a spanner wrench or other tool as would be known to one skilled in the art, may be sufficient to compress the precursors as desired. In other embodiments, a plunger (180) may be provided to increase or improve compression, as seen in FIGS. 5 and 6.

In other embodiments, it may not be desirable to compress precursors, or the superconducting joining material (600) itself. In such cases, it may be possible or desirable to form a poured cap (144) by pouring and then hardening a layer of liquefied metal, such as Wood's metal, to protect the superconducting joining material (600), as seen in FIG. 6. In such an embodiment, the poured cap (144) may not be compressive.

In various embodiments, the joining block (100) may be a single unit, while in other embodiments it may be multi-part, such as is seen in FIGS. 1-2 and 5-6, where the joining block (100) is formed by having a body (110) attached to a base plate (190), which may in turn be attached to other structures by means of a base plate mounting (192). In certain embodiments, as would be known to one skilled in the art, and as seen in FIG. 1, the joining block (100) may further include an insulator (400) electrically insulating the joining block (100), and the base plate (190) should one be provided, from a heat sink (500). In other embodiments, such a heat sink (500) may further include a cryocooler, or any such other cooling mechanism as would be envisioned by one skilled in the art.

The joining block (100) may be formed from various materials and to various parameters, including but not limited to such parameters as electrical and thermal conductivity. In certain embodiments, the joining block (100) is formed at least in part by copper and a second metal selected from the group of metals consisting of stainless steel and chromium. In certain embodiments, the second metal may fully chemically separate the copper from the internal body surface (114), to prevent undesirable chemical interaction between the joining block (100) and the superconducting joining material (600). As a performance parameter, one skilled in the art may be able to fabricate low loss joints (10) having an electrical resistance of less than $10^{-12}$ Ohm.

Figure 7:
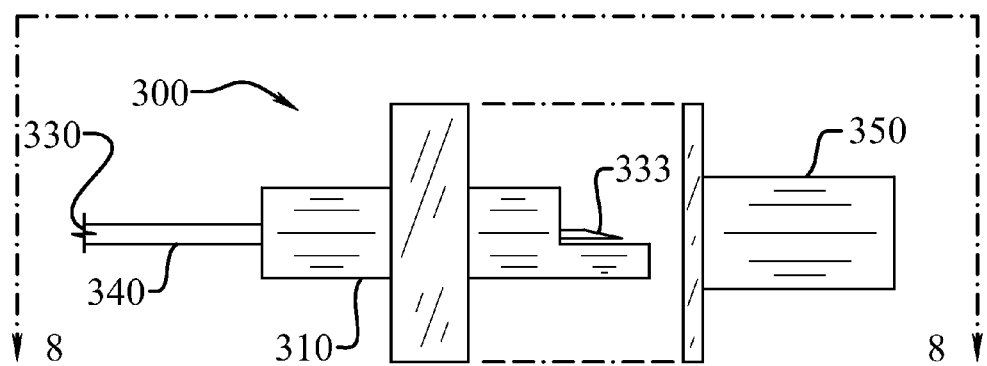
FIG. 7 shows a side view of a detail of the embodiment of FIG. 1.
Figure 8:
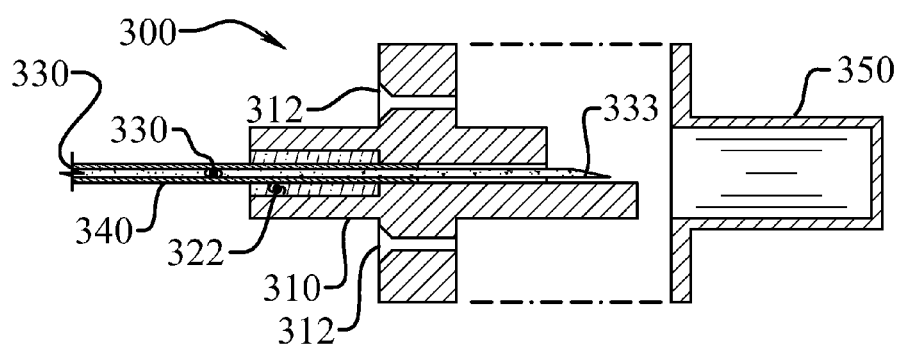
FIG. 8 shows a cross section view of a detail of the embodiment of FIG. 1.
Figure 9:
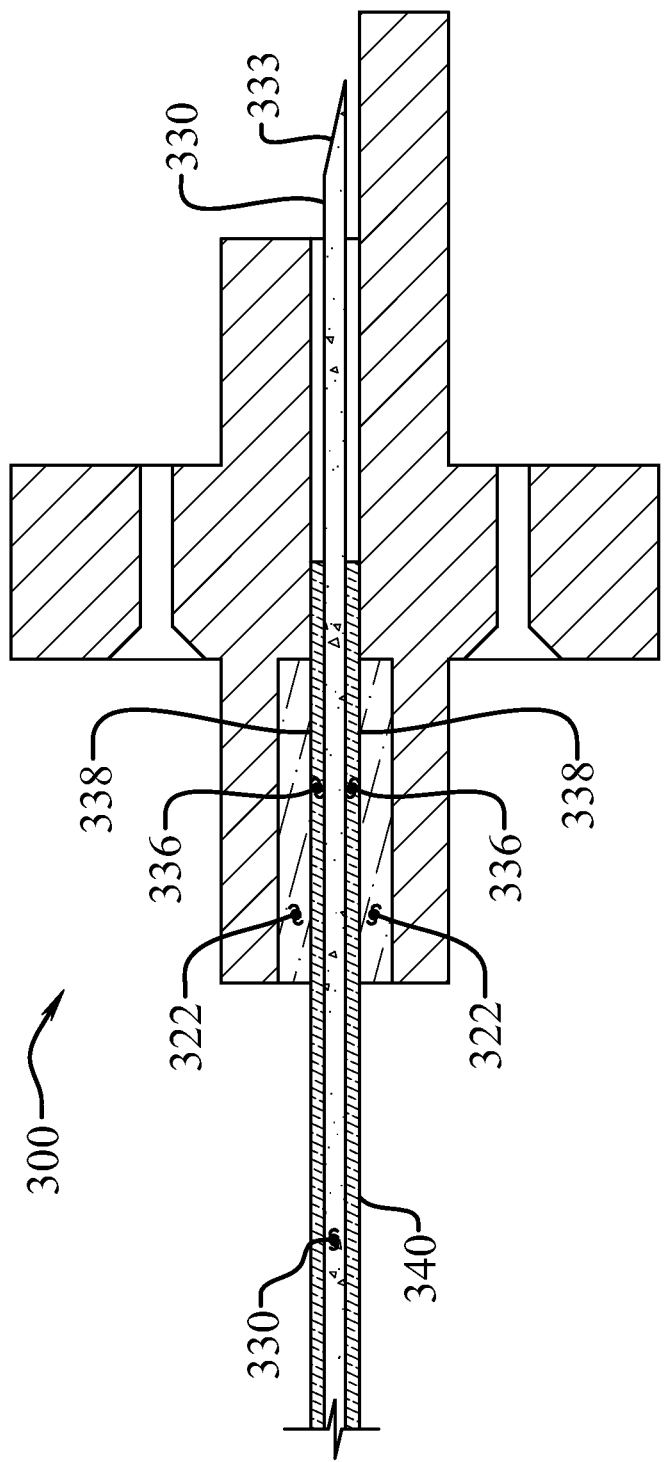
FIG. 9 shows a further cross section view of an enlarged detail of FIG. 8.

In certain embodiments, such as may be seen well in FIGS. 1-9, and in particular in detail in FIGS. 7-9, the low loss joint (10) includes a superconducting wire termination assembly (300) that further includes a superconducting wire termination assembly body (310) extending into the variable volume block cavity (120) from the external body surface (112) through the at least one superconducting wire termination assembly port (170) to the internal body surface (114). The superconducting wire termination assembly (300) may be attached to the body (110) by means of a superconducting wire termination assembly mounting (312) of many different design possibilities, including screws or bolts such as are seen well in FIGS. 1-6. Prior to assembly to the body (110), the superconducting wire termination assembly (300) may be protected by a removable superconducting wire protective cap (350), as seen in FIGS. 7 and 8.

The superconducting wire termination assembly (300) may also have a superconducting wire termination assembly wire opening (320) at least partially enclosing the at least one superconducting wire (330), as seen well in FIGS. 1, 4, and 5-6. In some embodiments, the superconducting wire termination assembly wire opening (320) may be at least partially filled with a superconducting wire termination assembly wire opening sealant (322), which as one skilled in the art would know, may include urethanes or other compounds, and which provides physical support to the superconducting wire (330).

Numerous options exist as to treatments for the termination of the superconducting wire (330) in the low loss joint (10). In a typical embodiment, a portion of the superconducting wire stabilizer (340) may be stripped back some distance from the termination by chemical etching, which will preferentially remove such elements from the superconducting wire stabilizer (340) as Ni—Cu alloy and copper (Cu), leaving an exposed segment of superconducting wire (330), and in particular, areas of Nb and $MgB_2$. In certain embodiments the superconducting wire (330) may be cut, at least in part to form a maximal exposed superconducting surface, to form a superconducting wire cut surface (333) that is cut at an angle between 10 and 90 degrees to a longitudinal axis of the superconducting wire (330), such as is seen in FIGS. 2 and 5-8.

In certain embodiments, particularly those employing compression of the superconducting joining material (600) it may be desirable to place the superconducting wire (330) in the joining block (100) such that the superconducting wire cut surface (333) is oriented such that the superconducting wire cut surface (333) at least in part faces towards the first variable position closure (140), as is seen in FIGS. 2 and 5-8.

The superconducting wire (330) may be cut by a wide variety of methods, subject to certain difficulties in mechanical cutting such as are described above. In one embodiment, the superconducting wire cut surface (333) is cut by means of a laser. In certain embodiments, it may be necessary to polish the superconducting wire cut surface (333) after cutting, and in consideration of certain difficulties involved in mechanical handling and polishing as described above, it may be desirable to polish the superconducting wire cut surface (333) with B powder having a grit size less than 1 micron.

The superconducting joining material (600) may be formed in a wide variety of methods, all of which are envisioned here, although only certain embodiments will be discussed. In one series of embodiments, the superconducting joining material (600) may be formed from a precursor that is itself selected from material forms that may include powder, solids, semi-solids and sol-gels. Particularly, but not exclusively, when using powder precursors, the precursor may be compressed to 60% to 100% of maximum density and subsequently heat reacted to form a superconducting material. The chemical composition of precursors may vary, and in certain embodiments, these precursor materials may be selected from the group of materials consisting of $MgB_2$, Mg, B, and mixtures thereof.

In certain embodiments, the precursor may include approximately 70% Mg and 30% B, while in other embodiments the precursor may include approximately 90% Mg and 10% B. This composition may be supplied in many ways, as would be known to one skilled in the art, including a powder that includes approximately 70% Mg and 30% B, and a powder including considerably less percentage weight of Mg, with supplemental Mg contributed by such diverse sources as Mg pellets or other solids dispersed in the powder, or as a Mg lining (116), discussed below, formed on at least a portion of the internal body surface (114), or otherwise contained within the variable volume block cavity (120), as illustrated well in FIGS. 5 and 6. Any powder form may be supplied as various slurry forms. In other embodiments, the superconducting joining material (600) further includes sol-gel forms, which may further include Mg, B, and $MgB_2$ sol-gels.

In yet other embodiments, referenced above and illustrated in part in FIGS. 5 and 6, the internal body surface (114) may include a lining (116) having Mg in the form of powder, strip, foil, chucks, or any other form as would be known by one skilled in the art, formed on at least a portion of the internal body surface (114) or distributed within the B powder in order to provide a further, or even possibly an exclusive, source of Mg for reaction into superconducting joining material (600).

As one skilled in the art will envision, the low loss joint (10) may be formed in a wide variety of methods, all of which are intended to be encompassed here, even though only a few have been discussed. In one embodiment, the low loss joint (10) may be formed beginning with cutting at least one insulated superconducting wire (330) to form a superconducting wire cut surface (333). The superconducting wire cut surface (333) may then be placed within a joining block (100) having a variable volume block cavity (120), a variable volume block cavity volume (122) and at least a first block opening (130), such that the superconducting wire cut surface (333) lies within the variable volume block cavity volume (122).

The variable volume block cavity volume (122) may then be filled with precursors of a superconducting joining material (600) further comprising at least one metallic material selected from the group of metallic materials consisting of $MgB_2$, Mg, B, and mixtures thereof. These precursors may then be sealed from an ambient atmosphere by sealing the first block opening (130) with a first variable position closure (140). By use of a threaded cap (142), plunger (180) or any other means as would be known to one skilled in the art, the precursors of a superconducting joining material (600) may be compressed and maintained to a compression of between 60% and 100% of maximum density. While under compression, the joining block (100), containing the compressed precursors may be heated to a predetermined temperature of at least 550° C. and not more than 900° C. and maintained at that predetermined temperature for a time of at least one minute and not more than 1200 minutes. The joining block (100) may then be slowly cooled, and eventually, for use, cooled to a superconducting temperature as required for the materials used.

In further embodiments, the step of compressing the precursors of a superconducting joining material (600) to between 60% and 100% of maximum density may be further refined to include the step of compressing and maintaining the compression of the precursors of a superconducting joining material (600) to between 70% and 80% of maximum density.

In addition to the composition parameters discussed above, the precursors to the superconducting joining material (600) are subject to further refinement, as would be known to one skilled in the art. In one series of embodiments, the step of filling the variable volume block cavity volume (122) with precursors of a superconducting joining material (600) may include filling the variable volume block cavity volume (122) at least in part with a material having a composition of approximately 70% Mg and 30% B, or in other embodiments a material having a composition of approximately 90% Mg and 10% B.

In another series of embodiments, that may not require compression of precursors, steps of formation of a low loss joint (10) may include, first, cutting at least one insulated superconducting wire (330) to form a superconducting wire cut surface (333). As before, the superconducting wire cut surface (333) may be placed within a joining block (100) having at least a first block opening (130) and a variable volume block cavity (120) having a variable volume block cavity volume (122) such that the superconducting wire cut surface (333) lies within the variable volume block cavity volume (122).

In another embodiment of a method, at least one superconducting wire (330) may be cut to form a superconducting wire cut surface (333) and placed within a joining block (100) having at least a first block opening (130) and a variable volume block cavity (120) having a variable volume block cavity volume (122). The superconducting wire cut surface (333) is placed so as to lie within the variable volume block cavity volume (122).

Next, at least a portion of the variable volume block cavity volume (122) may be filled with precursors of a superconducting joining material (600) that further include at least one sol-gel selected from the group of sol-gels consisting of $MgB_2$, Mg, and B.

The sol-gel, or combination of a plurality of sol-gels, is then heated to evaporate volatile compounds and solidify the gel. Lastly, the first block opening (130), may be sealed from an ambient atmosphere with a poured cap (144) formed from a liquid and subsequently hardened. For use, the joining block (100) is cooled to a superconducting temperature.

Numerous alterations, modifications, and variations of the preferred embodiments disclosed herein will be apparent to those skilled in the art and they are all anticipated and contemplated to be within the spirit and scope of the instant invention. For example, although specific embodiments have been described in detail, those with skill in the art will understand that the preceding embodiments and variations can be modified to incorporate various types of substitute and or additional or alternative materials, relative arrangement of elements, and dimensional configurations. Accordingly, even though only few variations of the present invention are described herein, it is to be understood that the practice of such additional modifications and variations and the equivalents thereof, are within the spirit and scope of the invention as defined in the following claims. The corresponding structures, materials, acts, and equivalents of all means or step plus function elements in the claims below are intended to include any structure, material, or acts for performing the functions in combination with other claimed elements as specifically claimed.

We claim:

1. A low loss joint (10) for superconducting wire (330), comprising;
    a joining block (100) integral to and in electrical connectivity with a completed joint (10) having a body (110) with an external body surface (112) and an internal body surface (114), a variable volume block cavity (120) in releasable fluid communication with an ambient atmosphere through at least a first block opening (130), a variable volume block cavity volume (122), at least a first variable position closure (140), and at least one superconducting wire termination assembly port (170);
    at least one superconducting wire (330) enclosed at least in part with superconducting wire stabilizer (340);
    at least one superconducting wire termination assembly (300) enclosing the at least one superconducting wire (330) extending into the variable volume block cavity (120) from the external body surface (112) to the internal body surface (114), and wherein,
    the variable volume block cavity (120) further comprises at least one superconducting joining material (600) substantially filling the variable volume block cavity (120) and in electrical communication with the at least one superconducting wire (330).

2. The device according to claim 1, wherein the superconducting wire termination assembly (300) further comprises a superconducting wire termination assembly body (310) extending into the variable volume block cavity (120) from the external body surface (112) through the at least one superconducting wire termination assembly port (170) to the internal body surface (114), a superconducting wire termination assembly mounting (312), and a superconducting wire termination assembly wire opening (320) at least partially enclosing the at least one superconducting wire (330).

3. The device according to claim 2, wherein the superconducting wire (330) includes a superconducting wire cut surface (333) that is cut at an angle between 10 and 90 degrees to a longitudinal axis of the superconducting wire (330).

4. The device according to claim 3, wherein the superconducting wire cut surface (333) is oriented such that the superconducting wire cut surface (333) at least in part faces towards the first variable position closure (140).

5. The device according to claim 3, wherein the superconducting wire cut surface (333) is laser cut.

6. The device according to claim 3, wherein the superconducting wire cut surface (333) has been polished with B powder having a grit size less than 1 micron.

7. The device according to claim 1, wherein the joining block (100) further comprises copper and a second metal selected from the group of metals consisting of stainless steel and chromium.

8. The device according to claim 7, wherein the second metal fully chemically separates the copper from the internal body surface (114).

9. The device according to claim 1, wherein the at least one superconducting material (600) is formed from a precursor comprising a form selected from the forms consisting of a powder, a solid, and a sol-gel form.

10. The device according to claim 9, wherein the powder is a powder compressed to 60% to 100% of maximum density and subsequently heat reacted to form a superconducting material.

11. The device according to claim 9, wherein the precursor is selected from the group of materials consisting of $MgB_2$, Mg, B, and mixtures thereof.

12. The device according to claim 9, wherein the precursor further comprises approximately 13% Mg and 30% B.

13. The device according to claim 9, wherein the precursor further comprises approximately 90% Mg and 10% B.

14. The device according to claim 1, wherein the joining block (100) further comprises an insulator (400) electrically insulating the joining block (100) from a heat sink (500).

15. The device according to claim 14, wherein the heat sink (500) further comprises a cryocooler.

16. The device according to claim 1, wherein the body (110) further comprises a second block opening (150) and a second block closure (160).

17. The device according to claim 1, wherein the body (110) further comprises a plunger (180).

18. The device according to claim 1, wherein the body (110) is joined to a base plate (190).

19. The device according to claim 1, including at least two superconducting wires (330).

20. The device according to claim 1, wherein the first variable position closure (140) further comprises a threaded cap (142).

21. The device according to claim 1, wherein the first variable position closure (140) further comprises a poured cap (144) formed from a poured liquid that is subsequently hardened.

22. The device according to claim 1, wherein the low loss joint (10) has an electrical resistance of less than $10^{-12}$ Ohm.

23. The device according to claim 1, wherein the variable volume block cavity (120) comprises a lining (116) comprising Mg formed on at least a portion of the internal body surface (114).

* * * * *